United States Patent
Guo et al.

(10) Patent No.: US 7,911,263 B2
(45) Date of Patent: Mar. 22, 2011

(54) LEAKAGE CURRENT MITIGATION IN A SEMICONDUCTOR DEVICE

(75) Inventors: Jong-Ru Guo, Hopewell Junction, NY (US); Louis Lu-Chen Hsu, Fishkill, NY (US); Rajiv Vasant Joshi, Yorktown Heights, NY (US); Ping-Chuan Wang, Hopewell Junction, NY (US); Zhijian Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 12/494,460

(22) Filed: Jun. 30, 2009

(65) Prior Publication Data

US 2010/0327958 A1 Dec. 30, 2010

(51) Int. Cl.
*G05F 1/10* (2006.01)
*G01R 31/26* (2006.01)

(52) U.S. Cl. .......... 327/544; 327/543; 327/546; 326/33; 326/34; 324/522; 324/763; 324/769

(58) Field of Classification Search .......... 327/543–546; 326/31, 33, 34; 324/522, 763, 765, 769
See application file for complete search history.

(56) References Cited

U.S. PATENT DOCUMENTS

| | | |
|---|---|---|
| 5,132,929 A | 7/1992 | Ochii |
| RE34,797 E | 11/1994 | Sato et al. |
| 5,936,902 A | 8/1999 | Hsu et al. |
| 6,693,448 B1 | 2/2004 | Okada et al. |
| 7,035,131 B2 | 4/2006 | Huang et al. |
| 7,196,571 B2 | 3/2007 | Sumita |
| 7,235,997 B2 | 6/2007 | Huang |
| 7,446,549 B2 * | 11/2008 | Tomita et al. .................. 324/763 |
| 7,564,274 B2 * | 7/2009 | Hughes .......................... 327/108 |
| 2006/0091936 A1 | 5/2006 | Ikenaga et al. |
| 2007/0145981 A1 | 6/2007 | Tomita et al. |

FOREIGN PATENT DOCUMENTS

JP 2007173493 7/2007

* cited by examiner

*Primary Examiner* — Lincoln Donovan
*Assistant Examiner* — Patrick O'Neill
(74) *Attorney, Agent, or Firm* — Preston J. Young

(57) ABSTRACT

A dormant mode target semiconductor device within a leakage current target unit is identified for mitigating leakage current to prevent it from reaching catastrophic runaway. A leakage current shift monitor unit is electrically connected to the output node of the leakage current target unit and collects leakage current from the selected target semiconductor device for two consecutive predefined temporal periods and measures the difference between the collected leakage currents. A comparator receives and compares the outputs of the current shift monitor unit and a reference voltage generator. The comparator propagates an alert signal to the leakage current target unit when the leakage voltage output from the leakage current shift monitor unit exceeds the reference voltage, a condition that indicates that the leakage current is about to approach catastrophic runaway levels. This alert signal switches the target semiconductor device to an active mode for leakage mitigation, which includes a repair voltage from a repair voltage generator applied to the gate of the target semiconductor device.

19 Claims, 5 Drawing Sheets

LEAKAGE CURRENT MITIGATION IN A SEMICONDUCTOR DEVICE

FIELD OF THE INVENTION

The present invention relates to the field of semiconductors and more particularly to an apparatus and method for mitigating leakage current in a semiconductor device before catastrophic leakage current runaway occurs. It should be understood that while the apparatus and method of the invention described herein relate to semiconductor devices generally, specific emphasis is placed on the present invention's application to metal oxide semiconductor field effect transistor (MOSFET) devices.

BACKGROUND OF THE INVENTION

Leakage current runaway is a catastrophic phenomenon that occurs in MOSFET devices during dormant mode when a MOSFET device is biased with full operating voltage (Vdd) across source and drain nodes while gate voltage is switched off. Normally, the leakage current in a dormant MOSFET device does not change with time. However, if the device channel length is sufficiently short, the leakage current, especially the drain induced barrier lower (DIBL) leakage current, will increase over time. In such cases, this DIBL current can possess enough energy to cause impact ionization inside the transistor channel and damage the device, resulting in a decrease in threshold voltage. A lowered threshold voltage prompts a further increase in DIBL leakage current, and subsequently, a chain reaction takes place with a positive feedback that eventually results in leakage current runaway.

Leakage current runaway is becoming a serious concern due to the ever increasing use of very short channels and extended dormant mode in high speed designs. The details of the leakage current runaway mechanism have been reported in a paper titled "Degradation and Recovery of NMOS Sub-threshold Leakage Current by Off-state Hot Carrier Stress" in 2006 ICCDCS. As discovered by the authors of this paper, the increase of the leakage current can be recovered by switching devices from dormant mode into active mode for a short period of time.

SUMMARY OF THE INVENTION

The embodiment of the invention broadly and generally provides a semiconductor circuit for mitigating leakage current, comprising:

at least one leakage current target unit comprising a target semiconductor device connected to a first switch control logic device, the aforesaid target semiconductor device being in a dormant mode;

a current shift monitor unit connected to the aforesaid leakage current target unit, the aforesaid monitor unit to collect leakage current from the aforesaid target semiconductor device for two consecutive predefined temporal periods, to convert the two collected leakage currents to two corresponding voltages, and measure the voltage difference therebetween;

a reference voltage generator that outputs a voltage signal used as a reference to define a critical shift in leakage current;

a comparator which receives the outputs of the current shift monitor unit and the reference voltage generator, the aforesaid comparator being configured to compare the aforesaid voltage difference from the aforesaid current shift monitor unit and the aforesaid reference voltage generator and to propagate an alert signal to the leakage current target unit when the leakage voltage output from the aforesaid current shift monitor unit exceeds the reference voltage;

a repair voltage generator which outputs a repair voltage to the aforesaid first switch control logic device, the aforesaid repair voltage being applied from the aforesaid first switch control logic device to the gate of the target semiconductor device in response to the aforesaid alert signal from the aforesaid comparator, the aforesaid alert signal thereby causing the aforesaid target semiconductor device to switch to an active mode for repair.

According to a preferred embodiment, the aforesaid current shift monitor unit comprises:

a second switch control logic device to receive leakage current from the aforesaid target semiconductor device;

at least two charge collecting devices connected to the aforesaid second switch control logic device, each of the aforesaid charge collecting devices being operable to alternately receive integrated current during at least the aforesaid two consecutive predefined temporal periods of time and to convert the charge to a voltage;

a differential amplifier connected to the aforesaid charge collecting devices, operable to receive voltages therefrom, the aforesaid differential amplifier further being operable to compare any change in voltages for the aforesaid consecutive periods and to output a first differential voltage between the aforesaid voltages of the aforesaid charge collecting devices to the comparator.

According to another preferred embodiment, the aforesaid current shift monitor unit further comprises:

a polarity switch connected to the aforesaid differential amplifier that reverses the polarity of the differential amplifier following the aforesaid comparison between the aforesaid voltages from the aforesaid charge collecting devices to thereby supply a second differential voltage output to the comparator.

According to another preferred embodiment, the aforesaid leakage current target unit, the aforesaid current shift monitor unit, the aforesaid reference voltage generator, the aforesaid comparator, and the aforesaid repair voltage generator are disposed on a single substrate of semiconductor material.

Preferably, the aforesaid target semiconductor device is a MOSFET and the aforesaid comparator is an op amp.

According to another preferred embodiment, the aforesaid voltage signal from the aforesaid reference voltage generator is an integer multiple of the aforesaid voltage difference from the aforesaid current shift monitor unit.

Preferably, the aforesaid repair voltage is between a threshold voltage for the target semiconductor device and an operating voltage for the aforesaid target semiconductor device.

According to another embodiment of the invention, the aforesaid semiconductor circuit further comprises a plurality of leakage current target units which are individually selected for leakage current measurement and mitigation via a multiplexer.

Preferably, the aforesaid plurality of leakage current target units are sequentially selected for leakage current mitigation.

According to another preferred embodiment, the aforesaid plurality of leakage current target units, the aforesaid current shift monitor unit, the aforesaid reference voltage generator, the aforesaid comparator, and the aforesaid repair voltage generator are disposed on a single substrate of semiconductor material.

Another embodiment of the invention also provides a method for detecting and mitigating leakage current runaway on a target semiconductor device, the method comprising:

collecting leakage current from a dormant target semiconductor device for two consecutive predefined temporal periods;

converting the two collected leakage currents to two corresponding voltages;

measuring the voltage difference between the aforesaid two corresponding voltages;

providing a reference voltage to define a critical shift in the leakage current;

comparing the aforesaid reference voltage with the aforesaid voltage difference;

submitting an alert signal in response to the aforesaid voltage difference exceeding the reference voltage; and submitting a repair voltage to the gate of the target semiconductor device to mitigate current leakage in the aforesaid target semiconductor device in response to the aforesaid alert signal.

According to another preferred embodiment, the aforesaid collection of leakage current from a dormant target semiconductor device for two consecutive predefined temporal periods further comprises distributing the leakage current to two charge collecting devices which are operable to alternately collect current for two consecutive predefined temporal periods of time.

According to another preferred embodiment, the aforesaid measuring of the voltage difference between said two corresponding voltages further comprises using a differential amplifier to receive voltages from the aforesaid two charge collecting devices, to thereby output the aforesaid voltage difference to a comparator.

According to another preferred embodiment, the aforesaid measuring of the voltage difference between said two corresponding voltages further comprises the use of a polarity switch connected to the aforesaid differential amplifier to reverse the polarity of the differential amplifier after the aforesaid output of the aforesaid voltage difference and to thereby provide a second voltage difference to the comparator.

Preferably, the aforesaid method is performed on a MOSFET semiconductor device.

Preferably, the aforesaid repair voltage is between a threshold voltage for the target semiconductor device and an operating voltage for the aforesaid device.

According to another embodiment, the aforesaid reference voltage is an integer multiple of the aforesaid voltage difference.

Preferably, the aforesaid reference voltage is twice the aforesaid voltage difference.

BRIEF DESCRIPTION OF THE DRAWINGS

The features and advantages of the invention will be more clearly understood from the following detailed description of illustrative embodiments thereof, which is to be read in connection with the accompanying drawings.

DETAILED DESCRIPTION OF THE INVENTION

One or more embodiments of the invention provide a method and circuit for detecting and mitigating leakage current shift in a semiconductor device, particularly in a MOSFET device, before catastrophic leakage current runaway occurs.

Figure 1:
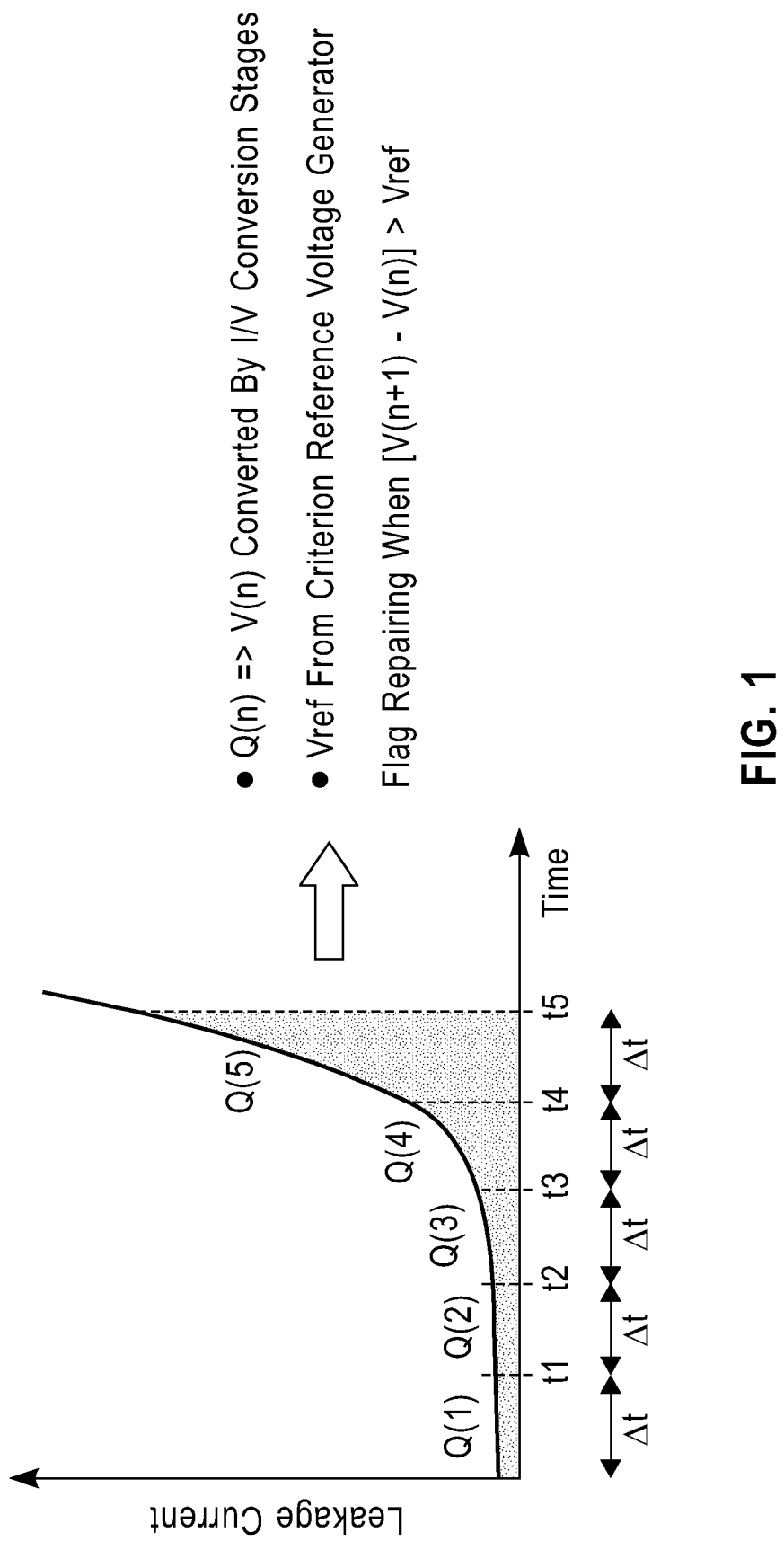
FIG. 1 is a graphical plot of a leakage current change for a semiconductor device during a dormant state.

As shown in FIG. 1, a charge (Q) due to leakage current in a target semiconductor device in a leakage current target is collected for a plurality of discrete temporal periods ($\Delta t$). According to a sample embodiment, the semiconductor device is a MOSFET device in dormant mode. During a first temporal period $t_1$, a second temporal periods $t_2$, and a third temporal period $t_3$, the charge due to leakage for each temporal period is not significantly different from one temporal period to the next (i.e., less than about 25% change) so there is no significant leakage current shift. During a fourth temporal period $t_4$, however, the charge Q due to leakage current is significantly larger than during the previous temporal period $t_3$ (i.e., greater than 200% change). During a fifth temporal period $t_5$ the charge Q due to leakage current increases exponentially over the previous temporal period $t_4$ as runaway leakage current occurs. Thus, there is a significant shift in leakage current due to the charge Q increases (between the third and fourth temporal periods in the illustrated example), which is a precursor to leakage current runaway.

In accordance with one embodiment of the invention, the charges collected during two consecutive temporal periods (n) and (n+1) are stored as voltage potentials $V(n)$ and $V(n+1)$, respectively, on current to voltage conversion devices, such as a capacitor. A difference between the voltages for consecutive temporal periods ($V(n+1)-V(n)$) is determined using such current to voltage conversion devices.

A reference voltage Vref is used to identify critical differences in voltage provided by the charge Q between consecutive temporal periods sufficient to cause leakage current shift which is a precursor to leakage current runaway. The reference voltage Vref, which is submitted by the reference voltage generator, may be either a fixed voltage or may be a function of the charge Q for an earlier one of two consecutive temporal periods. For example, the reference voltage Vref may be a multiple of the voltage for the earlier of two consecutive temporal periods ($mV(n)$). More specifically, according to an illustrative embodiment, the reference voltage Vref may be equal to twice the voltage for the earlier temporal period ($2V(n)$).

Figure 2:
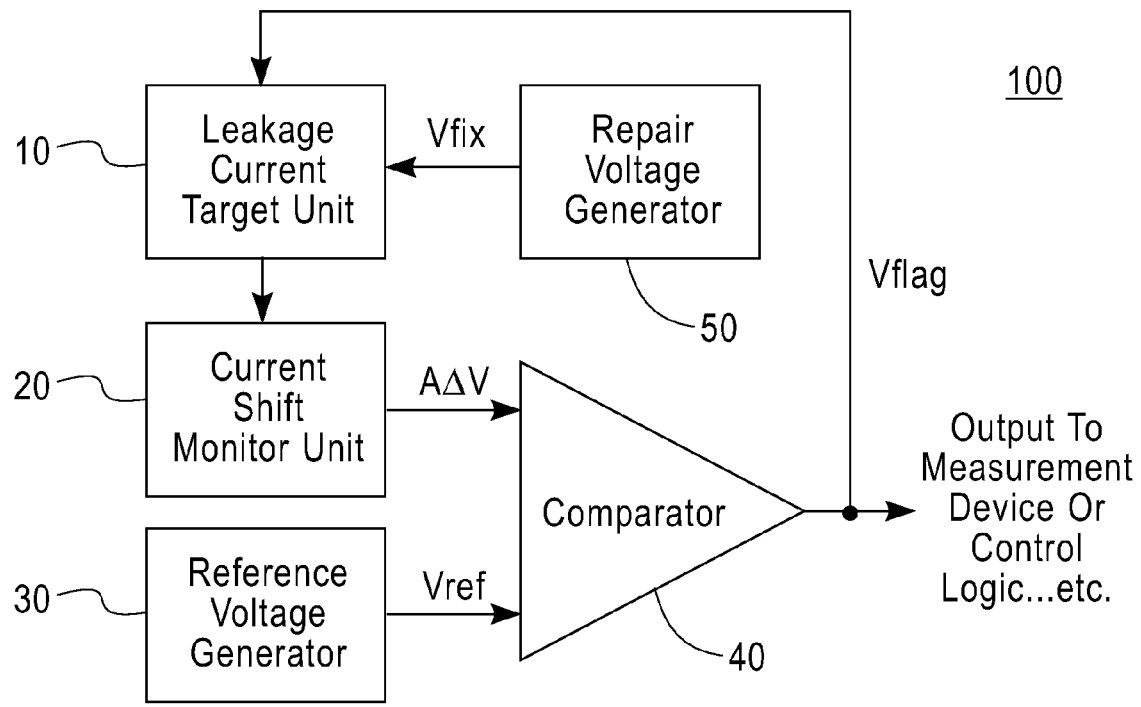
FIG. 2 is a block diagram of a semiconductor circuit for mitigation of leakage current for a single semiconductor device according to an embodiment of the invention.

FIG. 2 is a block diagram of one embodiment of the invention, in the form of a circuit 100 for detecting and mitigating leakage current shift in a semiconductor device, such as a MOSFET device during dormant mode. As can be seen in FIG. 2, circuit 100 comprises a leakage current target unit 10, a current shift monitor unit 20, a reference voltage generator 30, a comparator 40, and a repair voltage generator 50.

To detect the onset of leakage current runaway, the difference in voltages for consecutive temporal periods is compared to the reference voltage. A leakage current shift from the leakage current target unit 10 is detected when the difference in voltage for consecutive temporal periods is greater than the reference voltage, as represented by the following equation:

$$[V(n+1)-V(n)] > Vref \qquad \text{(eq. 1)}$$

In the present invention, the leakage current shift indicating an imminent leakage current runaway is mitigated by applying a repair voltage Vfix to the control node of a target semiconductor device, for example, to the gate of a MOSFET device while concurrently switching the target semiconductor device from a dormant to an active mode. According to one embodiment, the repair voltage Vfix is a voltage having a magnitude between a threshold voltage for the MOSFET device and an operating voltage for the MOSFET device. It should be noted that the threshold voltage and operating voltage are characteristic properties of a MOSFET device and are readily obtainable.

Figure 3:
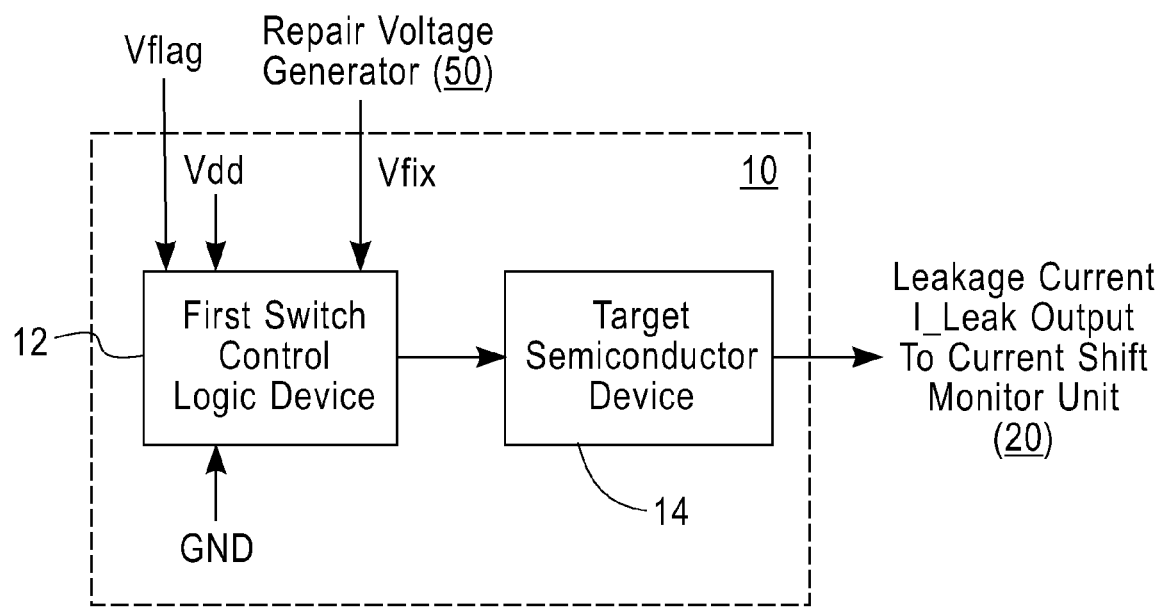
FIG. 3 is a block diagram of a leakage current target unit containing a switch control logic device and target semiconductor device according to an embodiment of the present invention.

As can be seen in FIG. 3, the current shift monitor unit 20 is electrically connected to the target semiconductor device 14, so that leakage current from the target semiconductor device 14 flows into the current shift monitor unit 20. The current shift monitor 20 collects the charge due to leakage current for consecutive temporal periods and converts the leakage currents into corresponding voltages. The current shift monitor unit 20 monitors the leakage current from the target semiconductor device 14 by measuring any difference or shift in the voltages during said consecutive temporal periods. The current shift monitor unit 20 provides an amplified signal of the voltage difference (AΔV) over consecutive temporal periods due to a leakage current shift as an output.

A reference voltage generator 30 produces a voltage signal (Vref) which is used as a threshold to define a critical shift in the leakage current. The reference voltage Vref may have a fixed voltage value corresponding to a critical shift for the target MOSFET device 14. Alternatively, the reference voltage Vref may be a function of one of the two voltage values (V(n)) saved by the current shift monitor unit 20 during previous monitoring of leakage current over two consecutive temporal periods. In one embodiment, the reference voltage Vref is a multiple of the earlier of the two voltages (V(n)) measured by the current shift monitor unit 20 at two prior temporal periods. According to an illustrative embodiment, the reference voltage is equal to twice the value of the earlier of the two voltages (V(n)).

The outputs of the voltage difference signal (AΔV) provided by the current shift monitor unit 20 and the reference voltage Vref from the reference voltage generator 30 are input into a comparator 40, which according to one embodiment is an op amp. The comparator 40 compares the voltage difference signal (AΔV) to the reference voltage Vref. If the voltage difference signal (AΔV) is greater than the reference voltage Vref, then the comparator 40 sends a repair signal Vflag to the leakage current target unit 10. The presence of the repair signal Vflag applied to the leakage current target unit 10 allows the voltage Vfix from the repair voltage generator 50 to mitigate the leakage current runaway of the target semiconductor device 14 by switching it from a dormant to active state.

FIG. 3 is a block diagram showing the leakage current target unit 10 of the circuit 100 (FIG. 2) comprising a MOSFET device or other target semiconductor device 14 in dormant mode to be monitored for leakage current shift and a first switch control logic device 12 to mitigate leakage current runaway. The first switch control logic device 12 will be subsequently explained in more detail, but it essentially switches the repair voltage Vfix from the repair voltage generator 50 to the gate of the target semiconductor device 14 when the signal Vflag is present. The target semiconductor device 14 has an input node, an output node, and a control node. In the following description the target device is a N-type MOSFET device and the input node is a drain, the output node is a source and the control node is a gate, as is known in the art. The present invention encompasses other semiconductor devices as well, including P-type devices where the drain is the output node and the source is the input node. Moreover, the target semiconductor device 14 may be metal on silicon or any other composition within the broader definition of a MOSFET device (i.e. using non-metal conductive lines and contacts, polysilicon, galium arsenide or other semiconductive channel).

In a sample embodiment, the first switch control logic device 12 receives a plurality of input options, selects the appropriate bias conditions, and feeds the selected bias voltage to the target semiconductor device 14. The voltage Vdd triggers the target semiconductor device 14 to an active mode (i.e. switches the target semiconductor device "on"); ground GND is applied for "dormant" mode (i.e. switches the target semiconductor device to "off" or "standby"); and the repair voltage Vfix in the presence of alert voltage Vflag, which has the effect of switching the target semiconductor device 14 to an active mode, is applied to prevent significant leakage current shift in the target semiconductor device 14. In response to a control signal for turning a target semiconductor device 14 on, the first switch control logic device 12 switches the operating voltage Vdd to the gate of the target semiconductor device 14. In response to a control signal for switching the target semiconductor device 14 to a dormant mode, the first switch control logic device 12 switches the ground voltage GND to the gate of the target semiconductor device 14. In response to an alert or repair signal Vflag from the comparator 40, the first switch control logic device 12 switches the repair voltage Vfix to the gate of the target device 14. It should be understood that repair voltage Vfix could alternatively be switched using a separate switching device via the operational and ground voltages.

Figure 4:
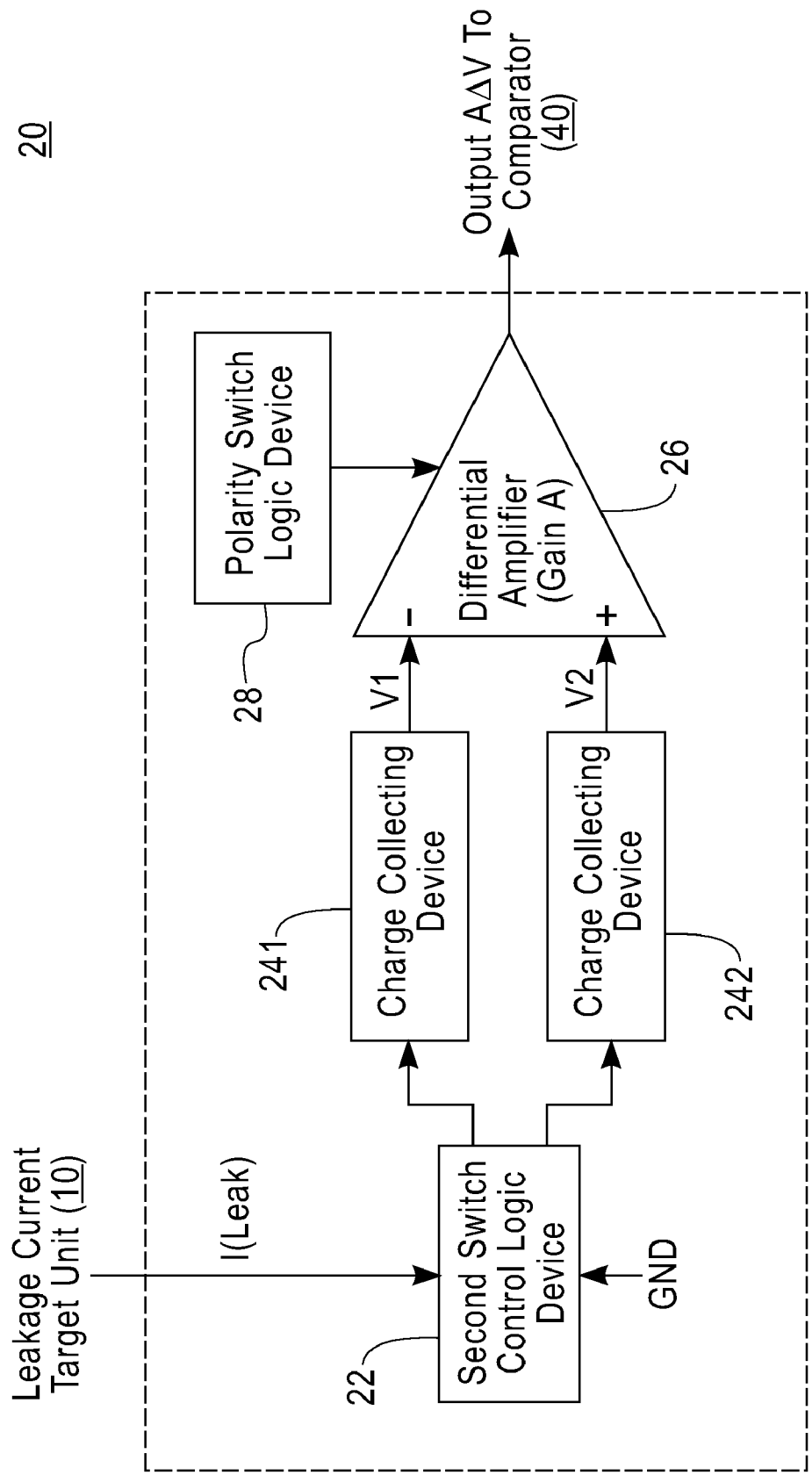
FIG. 4 is a block diagram of a leakage current shift monitor unit according to an embodiment of the present invention.

FIG. 4, is a block diagram showing the current shift monitor unit 20 in detail according to the present embodiment. The current shift monitor unit 20 comprises a second switch control logic device 22, two charge collecting devices 241 and 242, and a differential amplifier 26 with polarity controlled by a polarity switch logic device 28. In a illustrative embodiment, the charge collecting devices 241 and 242, are capacitors which convert the leakage current to a voltage potential.

Following is an exemplary embodiment to illustrate the operation of the current shift monitor unit 20 to measure the leakage current from the target semiconductor device 14. As shown in FIG. 4, leakage current I(LEAK) flows from the leakage current target unit 10 into a second switch control logic device 22. The second switch control logic device 22 switches the leakage current I(LEAK) onto a first one of the charge collecting devices 241, which integrates the leakage current over a period of time Δt between times t0 and (t0+Δt) to generate a voltage V1(t1). The first charge collecting device 241 feeds V1(t1) to a negative (−) port of a differential amplifier 26. Then at t1 the second switch control logic device 22, in response to time t1 from a timing circuit or clock, switches the leakage current I(LEAK) from the first charge collecting device 241 to a second charge collecting device 242. Then from time t1 to time (t1+Δt), the second charge collecting device 242 integrates the subsequent leakage current and generates voltage V2(t2) feeding to the positive (+) port of the differential amplifier 26. With a gain of A, the differential amplifier 26 outputs a voltage of A*(V2−V1) or AΔV(t2), to a first port of the comparator 40, which completes the first leakage current comparison cycle.

The comparator 40, shown in FIG. 2, receives the signal AΔV(t2) on a first port and a reference voltage Vref on a second port. According to an illustrative embodiment described previously, the comparator 40 is an op amp that generates a repair signal Vflag for submission to the leakage current target unit 10 if the signal A$\Delta$V from the differential amplifier 26 is greater than the reference voltage Vref.

Following the first comparison, the first charge collecting device 241 is discharged and refreshed for the collection of the leakage charges over the next period of time from t2 to (t2+$\Delta$t). The accumulated charge on the first charge collecting device 241 at time t3 generates a voltage V1 (t3), which is fed to the negative (−) port of the differential amplifier 26. The polarity of the differential amplifier 26 is then reversed by the polarity switch logic device 28, so that the polarities at the V2(t2) and V1(t3) nodes become negative (−) and positive (+), respectively. The output from the differential amplifier 26 then becomes A$\Delta$V(t3)=A*(V1−V2). The differential amplifier 26 outputs the new voltage of A*(V1−V2), or A$\Delta$V(t3), to a first port of the comparator 40, which completes the second leakage current comparison cycle.

The same procedure is then repeated continuously in the current shift monitor unit 20 to provide a sequence of voltage output A$\Delta$V(tn)=A*(V2−V1)*(−1)$^{(n+1)}$ that is proportional to the leakage current increase between times tn and t(n+1). Each comparison cycle has duration of $\Delta$t. Each time a leakage comparison cycle is completed (i.e. the comparison of output voltages from charge collecting devices, 241 and 242, over a consecutive temporal period), the charge collecting device having just been charged with leakage current over some period of time is discharged (i.e., the charge collecting device that is connected to the negative node of the differential amplifier). The second switch control logic device 22 then feeds additional leakage current to the mostly recently discharged charge collecting device and the polarity switch logic device 28 subsequently switches the polarity of the differential amplifier 26. The temporal period $\Delta$t or interval for collecting charge due to leakage current is pre-determined for the characteristics and the operating conditions of the device to be monitored, such as voltage and temperature. It may range from about a few seconds to about a few minutes. For a specific circuit, the circuit designers and manufacturers can pre-determine the value $\Delta$t based on these characteristics.

It should be noted that the delay between times (tn+$\Delta$t) and t(n+1) depends on the switching speed of the control logic, as well as the RC delay of the charge collecting device, and the circuit is designed so that this delay is insignificant compared with the leakage integration time $\Delta$t and, therefore, t(n+1)≅(tn+$\Delta$t) which will be used thereafter throughout the text to follow.

For detecting the early rise of leakage current, a pre-defined reference voltage Vref is provided by a reference voltage generator 30 shown in FIG. 2. As previously mentioned, a leakage current of a MOSFET device under dormant mode may increase gradually as the device is aged and degraded, which eventually leads to leakage current runaway and causes catastrophic failure in the device and circuit. Normally, the leakage current increases by more than a factor of three (3V(t0)) before leakage current runaway occurs. The reference voltage may be effectively defined, for example, by a doubling (2V(t0)) in leakage current from its initial value at time t0. Therefore, the trigger for detecting leakage current runaway occurs when the product of the gain and the voltage difference due to leakage current for a time $\Delta$t is greater than the reference voltage Vref.

It should be noted that it is important that the reference voltage generator 30 provides a stable output voltage Vref which does not vary with temperature, process variations, and power supply voltage, and the like. According to a sample embodiment, a band-gap reference is used to provide a stable reference voltage that is insensitive to voltage and temperature. The band-gap reference is a voltage reference circuit widely used in circuit designs; it provides 1.25V output voltage, close to the theoretical 1.22 eV band-gap voltage of Silicon at 0K.

The output from the current shift monitor unit 20 A$\Delta$V is compared against the reference voltage Vref using the voltage comparator 40. An alert or repair signal Vflag is generated when the product of the gain and the voltage difference from the differential amplifier 26 are greater than the reference voltage (i.e., A$\Delta$V>Vref), a critical point early in the detection of leakage current runaway when repair (i.e. leakage mitigation) is still possible. The alert signal Vlag is provided to the leakage current target unit 10, causing the target semiconductor device 14 (i.e. MOSFET) 14 to be switched from dormant mode (Vgate=Vsource=0V, Vdrain=Vdd) to an active mode to allow for leakage current mitigation by applying Vfix from the repair voltage generator 50 to the gate of the target semiconductor 14 (Vgate=Vfix, Vdrain=Vdd, Vsource=0V).

Figure 5:
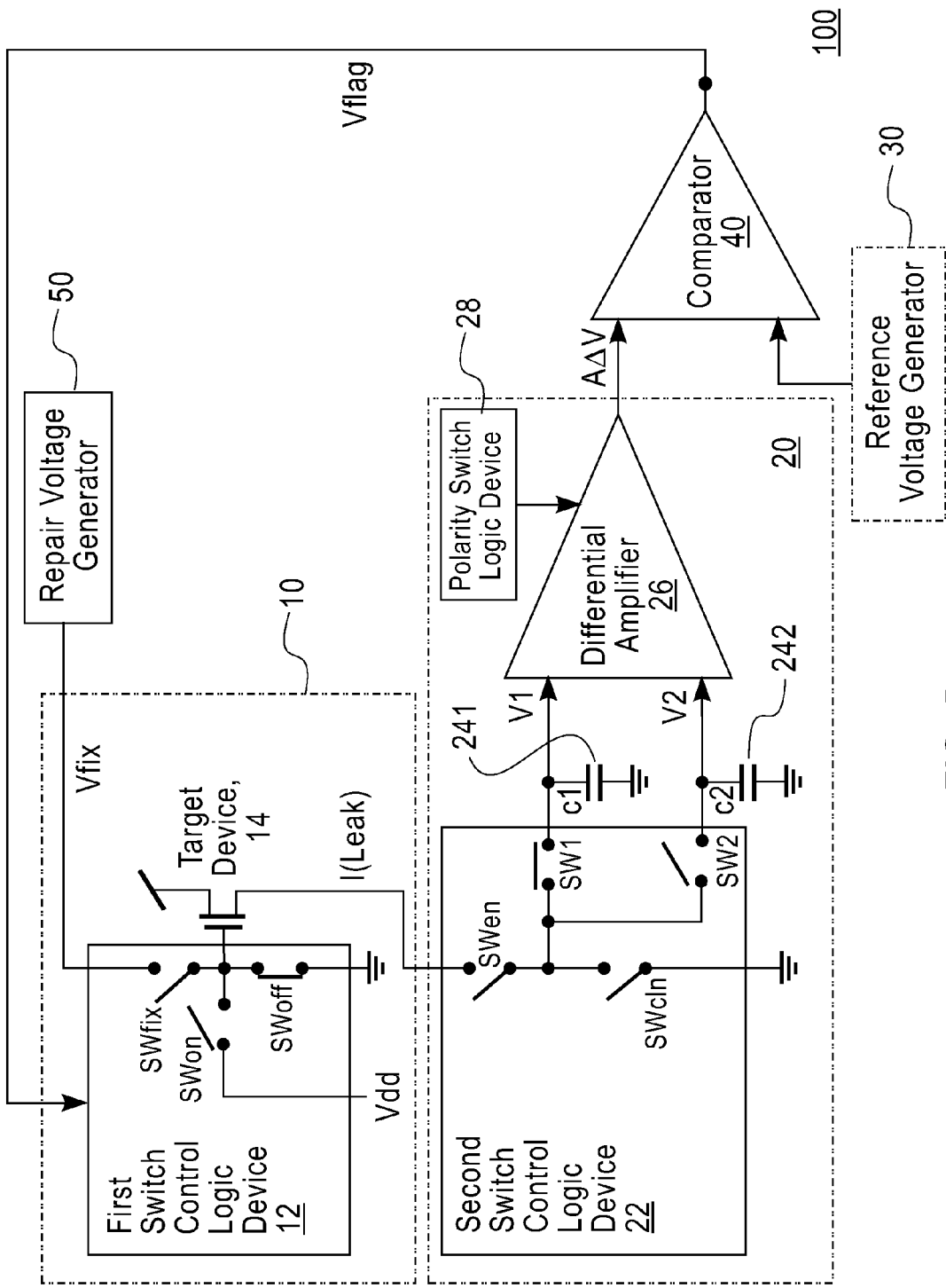
FIG. 5 is a schematic circuit diagram of the block diagram shown in FIG. 2 according to an illustrative embodiment.

FIG. 5 is an embodiment of a circuit diagram of the leakage current shift detection and mitigation circuit 100 shown previously in FIG. 2 with a single leakage current target semiconductor device 14. The first switch control logic device 12 may be comprised of a network of switches, a network of transistors configured as switches, or any other device or network suitable for switching one of two or more input voltages to an output in response to one or more control signals. In the illustrated sample embodiment, the first switch control logic unit 12 controls three switches: SWon, SWoff and SWfix for biasing the target semiconductor device 14 in operating, dormant, and repairing modes (i.e. leakage mitigation), respectively. As an example for monitoring leakage current, switches SWon and SWfix are both open, while switch SWoff is closed.

As also shown in FIG. 5, a second switch control logic device 22 in the current shift monitor unit 20 controls another four switches: SWen, SW1, SW2 and SWcln for enabling the leakage current monitoring by charging and discharging charge collecting devices 241 and 242 shown as capacitors C1 and C2, respectively, which as previously described also convert the collected current into corresponding voltages. As an example for monitoring leakage current shift from time t1 to time t2, switch SWen is first closed and the leakage current I(LEAK) directed to the first capacitor C1 to generate V1(t1) by closing switch SW1 while keeping both SW2 and SWcln open for the first period of time between t0 and t1. The leakage current I(LEAK) is then directed to the second capacitor C2 to generate V2(t2) by opening SW1 and closing SW2 for the next period of time from t1 to t2. Both switches SW1 and SW2 are then opened for comparison of the voltages on the capacitors C1 and C2 by the differential amplifier 26 to produce the voltage A$\Delta$V, which completes the first leakage current comparison cycle. The comparator 40 receives the signal A$\Delta$V and a reference voltage Vref from the reference voltage generator 30. The comparator generates a repair signal Vflag if the signal A$\Delta$V from the differential amplifier 26 is greater than the reference voltage Vref.

After the voltage A$\Delta$V is generated from the differential amplifier as a result of the comparison between V1(t1) and V2(t2), capacitor C1 is discharged by opening switch SWen and closing switches SW1 and SWcln. Leakage current within the next period of time $\Delta$t is again integrated by capacitor C1 to generate V1(t3). Note that, at this time, the polarity of the differential amplifier 26 is reversed by a polarity switch logic device 28 before comparing V1(t3) from capacitor C1 with V2(t2) from capacitor C2 in the differential amplifier 26 to generate a new voltage signal A$\Delta$V, which completes the second leakage current comparison cycle.

When target semiconductor device repairing (i.e. leakage mitigation) is triggered by the comparator 40, switch SWen is first opened by the second switch control logic device 22 to disable the current leakage monitoring process. In the presence of the repair signal Vflag, switch SWfix is closed via the first switch control logic device 12 while both switches SWoff and SWon are opened to bias the target semiconductor device 14 under repairing mode; this has the effect of switching the target semiconductor device 14 from a dormant to an active state.

Figure 6:
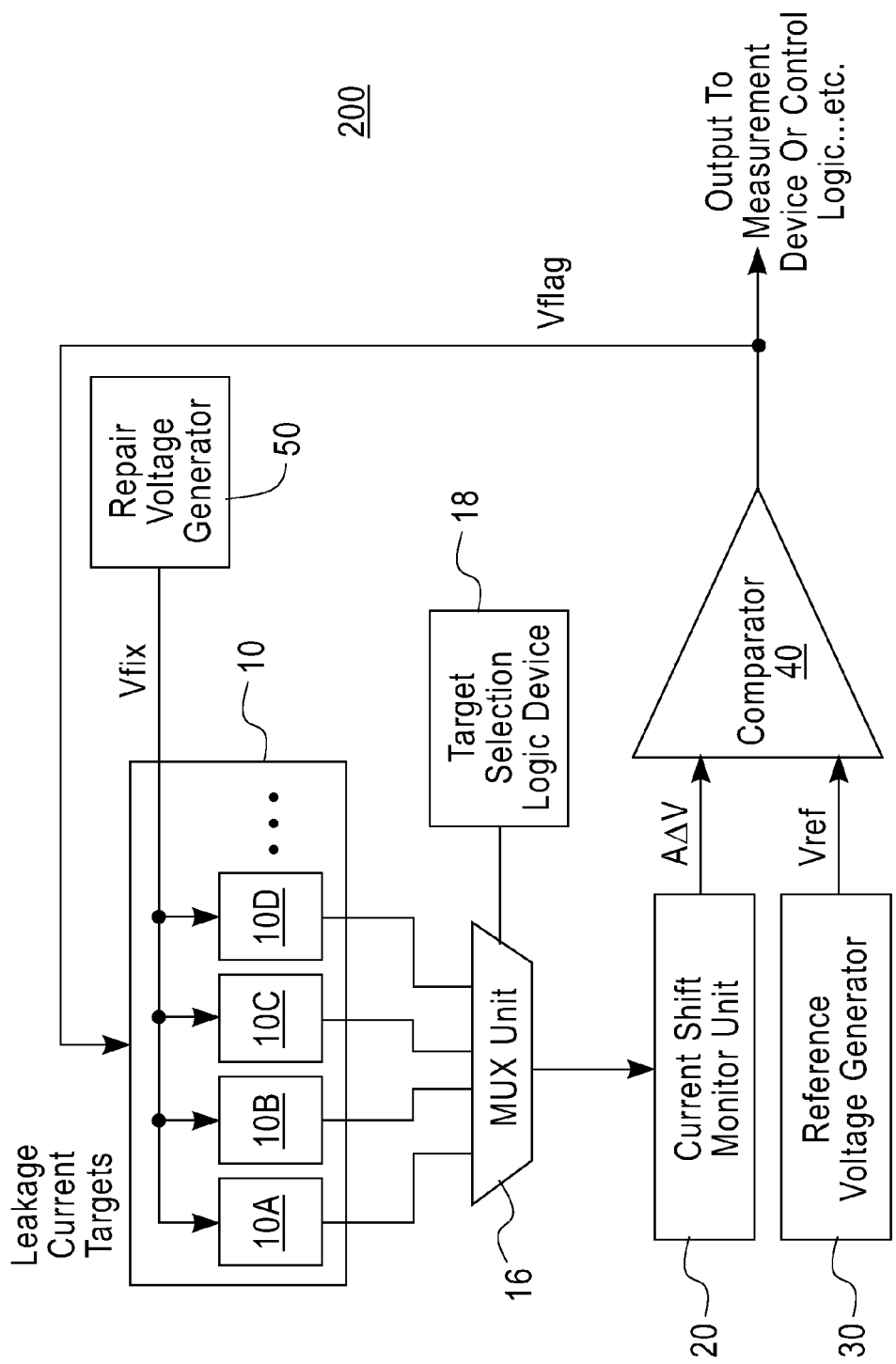
FIG. 6 is a block diagram of a semiconductor circuit for mitigation of leakage current for multiple semiconductor devices according to another illustrative embodiment.

FIG. 6 is a block diagram of another embodiment of a circuit 200 for detecting and mitigating leakage current shift within a plurality of leakage current target semiconductor units 10, individually designated as 10A, 10B, 10C, 10D, etc. Only one leakage current target unit is selected at a time, on which to perform leakage current monitoring and mitigation; such selection and repair is conducted via a multiplexer (MUX) unit 16 controlled by a target selection logic device 18. This arrangement effectively saves chip area when more than one leakage current target unit is present. Each leakage current target unit 10A, 10B, 10C, 10D, etc. consists of a switch control logic device and target semiconductor device as shown in FIG. 3. The current shift monitor unit 20, reference voltage generator 30, comparator 40, and repair voltage generator 50 are essentially the same as is illustrated in FIG. 2 and described previously.

The total testing period ($\Delta t(total)$) for a plurality of leakage current target units 10 is the sum of the test time for each individual unit 10A, 10B, 10C, 10D, etc., where each leakage current target unit is tested for consecutive temporal periods $\Delta t$. Thus, $\Delta t(total)$ should be short enough to identify and mitigate any single leakage current runaway event (e.g. not more than a few tens of a second in one embodiment of invention). A leakage current shift that is not mitigated in this time may cause permanent damage to a target semiconductor device. Consequently, the individual testing time $\Delta t$ of each target semiconductor device should be adjusted (or minimized) accordingly in order to accommodate the plurality of leakage current target units 10.

The preceding description and accompanying drawings are intended to be illustrative and not limiting of the invention. The scope of the invention is intended to encompass equivalent variations and configurations to the full extent of the following claims.

What is claimed is:

1. A semiconductor circuit for mitigating leakage current, comprising:
   at least one leakage current target unit comprising a target semiconductor device connected to a first switch control logic device, said target semiconductor device being in a dormant mode;
   a current shift monitor unit connected to said leakage current target unit, said monitor unit to collect leakage current from said target semiconductor device for two consecutive predefined temporal periods, to convert the two collected leakage currents to two corresponding voltages, and measure the voltage difference therebetween;
   a reference voltage generator that outputs a voltage signal used as a reference to define a critical shift in leakage current;
   a comparator which receives the outputs of the current shift monitor unit and the reference voltage generator, said comparator being configured to compare said voltage difference from said current shift monitor unit and said reference voltage generator and to propagate an alert signal to the leakage current target unit when the leakage voltage output from said current shift monitor unit exceeds the reference voltage;
   a repair voltage generator which outputs a repair voltage to said first switch control logic device, said repair voltage being applied from said first switch control logic device to the gate of the target semiconductor device in response to said alert signal from said comparator, said alert signal thereby causing said target semiconductor device to switch to an active mode for repair.

2. The semiconductor circuit of claim 1, wherein said current shift monitor unit comprises:
   a second switch control logic device to receive leakage current from said target semiconductor device;
   at least two charge collecting devices connected to said second switch control logic device, each of said charge collecting devices being operable to alternately receive integrated current during at least said two consecutive predefined temporal periods of time and to convert the charge to a voltage;
   a differential amplifier connected to said charge collecting devices, operable to receive voltages therefrom, said differential amplifier further being operable to compare any change in voltages for said consecutive periods and to output a first differential voltage between said voltages of said charge collecting devices to the comparator.

3. The semiconductor circuit of claim 2, wherein said current shift monitor unit further comprises:
   a polarity switch connected to said differential amplifier that reverses the polarity of the differential amplifier following said comparison between said voltages from said charge collecting devices to thereby supply a second differential voltage output to the comparator.

4. The semiconductor circuit of claim 3, wherein said leakage current target unit, said current shift monitor unit, said reference voltage generator, said comparator, and said repair voltage generator are disposed on a single substrate of semiconductor material.

5. The semiconductor circuit of claim 1, wherein said target semiconductor device is a MOSFET.

6. The semiconductor circuit of claim 1, wherein said comparator is an op amp.

7. The semiconductor circuit of claim 1, wherein said voltage signal from said reference voltage generator is an integer multiple of said voltage difference from said current shift monitor unit.

8. The method of claim 1, wherein said repair voltage is between a threshold voltage for the target semiconductor device and an operating voltage for said target semiconductor device.

9. The semiconductor circuit of claim 1 further comprising a plurality of leakage current target units which are individually selected for leakage current measurement and mitigation via a multiplexer.

10. The semiconductor circuit of claim 9, wherein said plurality of leakage current target units are sequentially selected for leakage current mitigation.

11. The semiconductor circuit of claim 9, wherein said plurality of leakage current target units, said current shift monitor unit, said reference voltage generator, said comparator, and said repair voltage generator are disposed on a single substrate of semiconductor material.

12. A method for detecting and mitigating leakage current runaway on a target semiconductor device, the method comprising:
   collecting leakage current from a dormant target semiconductor device for two consecutive predefined temporal periods;

converting the two collected leakage currents to two corresponding voltages;

measuring the voltage difference between said two corresponding voltages;

providing a reference voltage to define a critical shift in the leakage current;

comparing said reference voltage with said voltage difference;

submitting an alert signal in response to said voltage difference exceeding the reference voltage; and submitting a repair voltage to the gate of the target semiconductor device to mitigate current leakage in said target semiconductor device in response to said alert signal.

13. The method of claim 12, wherein said collection of leakage current from a dormant target semiconductor device for two consecutive predefined temporal periods further comprises distributing the leakage current to two charge collecting devices which are operable to alternately collect current for two consecutive predefined temporal periods of time.

14. The method of claim 13, wherein said measuring of the voltage difference between said two corresponding voltages further comprises using a differential amplifier to receive voltages from said two charge collecting devices, to thereby output said voltage difference to a comparator.

15. The method of claim 14, wherein said measuring of the voltage difference between said two corresponding voltages further comprises the use of a polarity switch connected to said differential amplifier to reverse the polarity of the differential amplifier after said output of said voltage difference and to thereby provide a second voltage difference to the comparator.

16. The method of claim 12, wherein said semiconductor device is a MOSFET.

17. The method of claim 12, wherein said repair voltage is between a threshold voltage for the target semiconductor device and an operating voltage for said device.

18. The method of claim 12, wherein said reference voltage is an integer multiple of said voltage difference.

19. The method of claim 18, wherein said reference voltage is twice said voltage difference.

* * * * *